United States Patent [19]

Ruberl

[11] Patent Number: 4,521,741
[45] Date of Patent: Jun. 4, 1985

[54] IMPEDANCE TRANSFORMER CIRCUIT

[75] Inventor: Ernst Ruberl, Guntramsdorf, Austria

[73] Assignee: AKG Akustische u.Kino-Geräte Gesellschaft m.b.H., Austria

[21] Appl. No.: 435,501

[22] Filed: Oct. 20, 1982

[30] Foreign Application Priority Data

Oct. 22, 1981 [AT] Austria ................................. 4523/81

[51] Int. Cl.³ ............................................. H03F 3/04
[52] U.S. Cl. ..................................... 330/277; 330/311
[58] Field of Search ................ 330/103, 104, 277, 311

[56] References Cited

U.S. PATENT DOCUMENTS 3,757,214 9/1973 Kime et al. .......................... 330/277
4,035,738 7/1977 Anzalone ............................. 330/277

FOREIGN PATENT DOCUMENTS 2456081 5/1975 Fed. Rep. of Germany.
2501288 10/1977 Fed. Rep. of Germany.

Primary Examiner—James B. Mullins
Assistant Examiner—G. Wan
Attorney, Agent, or Firm—McGlew and Tuttle

[57] ABSTRACT

In an impedance transformer circuit which is intended for capacitive voltage sources having a high output impedance, particularly for capacitor microphones, comprises two sequential amplifier stages with an overall gain of close to one. The output of the first amplifier stage having a large input impedance, and of itself, a high gain, is applied to the inverting input 2 of the second amplifier stage $V_2$, which, of itself, again exhibits a high gain and whose output is fed back to its non-inverting input through at least one feedback loop containing the first amplifier as a resistor controlled by the capacitive transducer. Further, in AC current terms, the load resistor of the first amplifier stage is located between the inverting input and the non-inverting input of the second amplifier stage, and the reference potential "0" for the input and output AC voltage signals is not provided by any of the inverting or non-inverting inputs of the two amplifier stages.

16 Claims, 4 Drawing Figures

IMPEDANCE TRANSFORMER CIRCUIT

FIELD AND BACKGROUND OF THE INVENTION

The present invention relates in general to circuits for processing capacitive voltages and in particular to a new and useful impedance transformer circuit for capacitive voltage sources having high output impedance.

It is known that capacitive transducers, particularly capacitor microphones, deliver an undistorted output voltage proportional to a diaphragm displacement only if, with the diaphragm (or equivalent structure) being moved, the electric charge applied to the capacitor transducer remains constant. Consequently, it seems imperative to prevent the amplifier or impedance transformer following the capacitive transducer from taking up any current as far as possible. This requirement can be satisfied only with a series connected amplifier or impedance transformer having a very high input impedance and a negligible input capacitance. Further, to prevent parasitic capacitances which may occur between the connections of active circuit elements, from discharging the capacitor transducer, with current flowing through the parasitic capacitors, general compensating measures are taken which are aimed at decidedly minimizing the differential DC voltage between the connections and the signal voltages appearing relative to the reference potential "zero". For this purpose, amplifiers comprising a field-effect transistor in bootstrap connection are commonly used, following the capacitive transducer. Such an amplifier which is intended to be employed for a standard microphone, is described in the manual for the "Artificial Voice" model 4219, by the company Brüel and Kjaer.

If the amplifier or impedance transformer only comprises a FET in sequential source connection, parasitic currents flowing through the parasitic capacitors of the FET in operation withdraw charges from the capacitive transducer, for example a capacitor microphone, with the result that at high sonic pressures, distortions appear in the output voltage. This may be remedied by operating the FET in bootstrap connection which is almost perfectly suited for removing distortion from the output voltage, however, has the substantial disadvantage of introducing a very strong noise into the signal.

SUMMARY OF THE INVENTION

The present invention is directed to a circuit of the above-mentioned kind which comprises two sequentially connected amplifier stages. The circuit of the invention, however, is not affected by any perceivable noise voltage at its output.

An object of the present invention is thus to provide an impedance transformer circuit for capacitive voltage sources having a high output impedance and particularly useful for capacitor microphones, which comprises two sequentially connected amplifier stages having an overall gain of less than 1 with an output of the first amplifier stage which itself exhibits high input impedance and high gain, as applied to an inverting input of the second amplifier stage which itself exhibits a high gain, the output of the second amplifier stage being fed back to its own non-inverting input through at least one feedback loop which contains the first amplifier stage acting as a resistor that is controlled by the capacitive transducer, wherein, with AC current, a load resistance of the first amplifier stage is located between the inverting input and the non-inverting input of the second amplifier stage and a reference potential of zero for the input and output AC voltage signals is not provided by any of the inverting or non-inverting inputs of the two amplifier stages.

The advantages of the invention are that the input impedance is very high and of low capacity, so that parasitic currents at the amplifier input are compensated for, and so that the signal-to-noise ratio at the amplifier output is substantially improved as compared to prior art circuits. The noise level at the output is suppressed by the fact that, although either of the amplifiers of itself exhibits a gain substantially larger than one, the overall amplification does not exceed the unity value due to the inventive negative feedback arrangement.

Another feature of the inventive design is that an FET in common-source connection is provided at the input and electrically conductively coupled to an oprational amplifier representing the second amplifier stage.

This common-source connection in itself already results in a large input impedance and a high gain which is far in excess of unity and proportional to the load resistance. Only, in practice, there are limits to the value of this resistance, since with an increasing resistance, the voltage drop thereacross might become excessive and prevent reaching of the predetermined operating voltage at the transistor. To obtain the maximum gain in such a transistor amplifier, it is provided to substitute for the load resistor a current source with a high dynamic internal resistance, thus a constant-current source.

The combination of an FET with an operational amplifier is advantageous in that the amplifier includes both an inverting and a non-inverting input, exhibits a large gain, and is commercially available at low cost. The operational amplifier might, of course, be replaced by an arrangement with discrete circuit elements, however, this would require at least two transistors and a plurality of passive elements.

A further object of the invention is to provide such a circuit which includes a field-effect transistor that is electrically conductively coupled to an operational amplifier employed as a second amplifier stage, with the field-effect transistor inserted in a common source connection.

Another object of the invention is to provide such a circuit wherein a current source is provided having a high dynamic internal resistance which acts as a load resistor for the field-effect transistor, which current source comprises a transistor connected as a constant current source.

A further object of the invention is to provide such a circuit wherein the second amplifier stage comprises a discrete unity formed of at least two transistors.

Another object of the invention is to provide an impedance transformer circuit which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DESCRIPTION OF THE PREFERRED EMBODIMENTS

Figure 1:
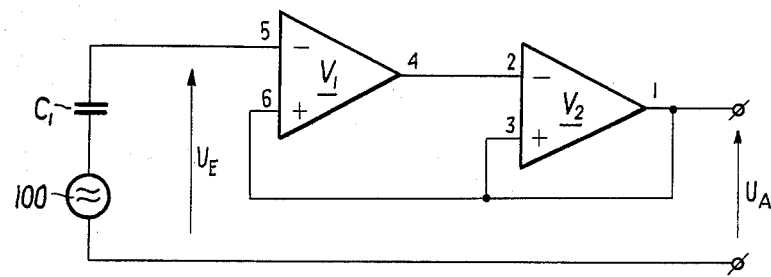
FIG. 1 is a basic schematic diagram of the invention.

As evident from FIG. 1, the inventive circuit comprises two amplifiers $V_1$ and $V_2$, each having a gain substantially exceeding unity. The output of the capacitive transducer at 100 is applied, on the one hand, to ground having the reference potential "0", and, on the other hand, through a capacitor $C_1$, to the input 5 of first amplifier stage $V_1$. The output 4 of stage $V_1$ is connected to input 2 which is an inverting input, of second amplifier stage $V_2$. The output 1 of second stage $V_2$ is returned to the non-inverting input 3 of this stage and to the non-inverting input 6 of first amplifier stage $V_1$. This constitutes two negative feedback loops, of which one is connected through amplifier $V_1$.

Figure 2:
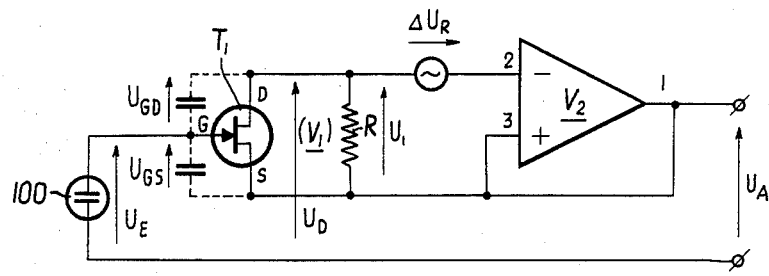
FIG. 2 is a similar, corresponding AC diagram.

An AC connection of the inventive circuit is shown in FIG. 2. The first amplifier stage $V_1$ having a gain $v_1$ is designed as a common-source connected FET $T_1$ and its D output is applied to the inverting input 2 of a second amplifier stage $V_2$ having a gain $v_2$. The load resistance R of first amplifier stage $V_1$ is connected between inverting input 2 and non-inverting input 3 of second amplifier stage $V_2$, and the output 1 of this stage is fed back to the non-inverting input 3 thereof. The AC voltages developing in this circuitry are designated as follows:

$U_E$: AC voltage at the first stage input;

$U_{GS}$: AC voltage between the gate and source electrodes of the FET;

$U_D$: AC voltage between the drain electrode and ground;

$U_A$: AC voltage at the output;

$U_1$: AC voltage at the second stage input; and $\Delta U_R$: noise voltage as referred to the inverting input of the second stage, including a-1 noise voltage sources outside the FET.

The gain of the first amplifier stage is given by the equation:

$$v_1 = -\frac{U_1}{U_{GS}} = -\frac{g_m R}{1 + g_{DS} R} \quad (1)$$

In addition, the following ratios apply:

$$v_2 = -\frac{U_A}{U_1} \quad (2)$$

$$U_E = U_A + U_{GS} \quad (3)$$

$$U_D = U_A + U_1 \quad (4)$$

It immediately follows from (1) and (2) that:

$$\frac{U_{GS}}{U_A} = \frac{1}{v_1 v_2} \quad (5)$$

Introducing of terms (5) and (3) results in:

$$U_E = U_A \left( 1 + \frac{1}{v_1 v_2} \right) \quad (6)$$

While using the equation (6) and taking into account equation (2), relation (4) can be rearranged to:

$$U_D = U_A \left( 1 - \frac{1}{v_2} \right) = U_E \frac{1 - \frac{1}{v_2}}{1 + \frac{1}{v_1 v_2}} \quad (7)$$

For large gains $v_1$ and $v_2$, for example $v_1 = 10^2$ and $v_2 = 10^3$, the obtained equations (6) and (7) show that the AC voltages $U_A$, $U_D$ and $U_E$ are almost equal to each other a numerical example assuming $g_m = 10^3$ (A/V); $g_{DS} = 10^{-6}$ mho; $R = 10^5$ ohm; and $v_2 = 10^3$ results in:

$$v_1 = \frac{1}{1.1} \, 10^2$$

$$U_D = U_E \frac{1 - 10^{-3}}{1 + 1.1 \times 10^{-5}} \cong U_E (1 - 10^{-3}) \text{ and}$$

$$U_E = U_A (1 + 1.1 \times 10^{-5})$$

In practice, the AC voltage between the gate and the source electrodes is smaller by five powers of 10 than the input voltage, and the AC voltage between the gate and the drain electrodes ($U_{GD}$) is smaller by three powers of 10 than the input voltage. Parasitic currents flowing through the existing parasitic capacitors of the FET are thus compensated for to the largest extent.

If all noises originating in the second amplifier stage and the load resistor of the first amplifier stage, and perhaps in other sources located outside the first amplifier stage, are combined to an equivalent noise voltage source with the voltage $\Delta U_R$ and located upstream of the inverting input of the second amplifier stage, the effect of the suppression of the noise voltage may be expressed mathematically as follows:

With the introduction of the noise voltage $\Delta U_R$, equation (2) becomes:

$$U_A = =v_2(U_1 + \Delta U_R) \quad (8)$$

From equations (1) and (3) it follows that:

$$U_E = U_A \left( 1 - \frac{U_1}{v_1 U_A} \right) \quad (9)$$

And is may be derived from equations (8) and (9) that:

$$U_A = U_E \frac{v_1 v_2}{1 + v_1 v_2} + (-\Delta U_R) \frac{v_2}{1 + v_1 v_2} \quad (10)$$

Equation (10) now shows that the AC voltage at the output is smaller than, but almost equal to, the AC voltage at the input, so that the arrangement has an amplification of close to one. However, any noise voltage appearing at the output is reduced by the factor $(1/v_1)$ relative to the AC voltage signal. Numerically, this means that the noise voltage is reduced to its 99th part.

Figure 3:
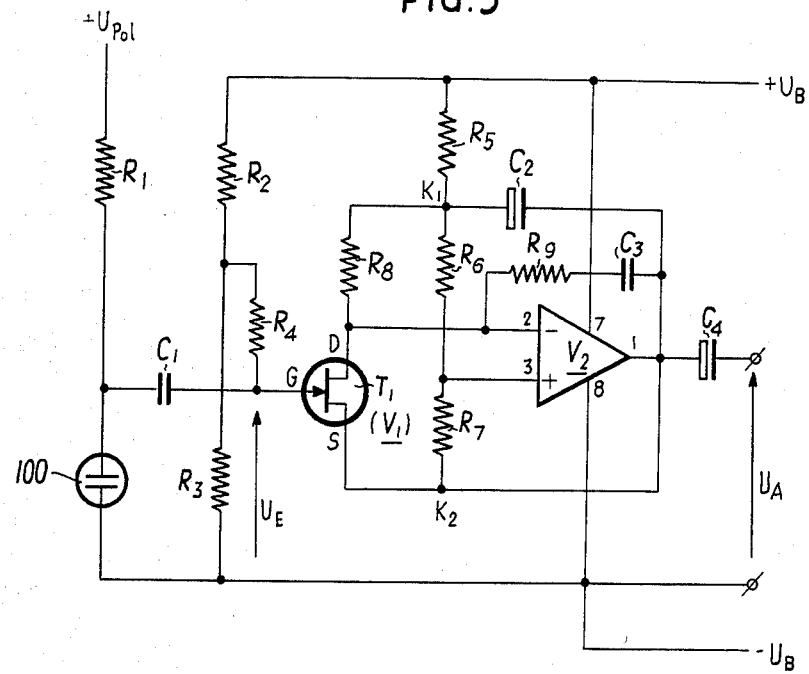
FIG. 3 shows a first embodiment of the inventive circuitry.

The arrangement described in principle in the foregoing is shown as a diagram in FIG. 3. The first amplifier stage comprises a FET $T_1$ having its operating voltage $+U_B$ applied to the load resistor $R_8$ through a resistor $R_5$. To adjust the operating point of FET $T_1$, a high-resistance voltage divider formed by resistors $R_2$ and $R_3$ and feed resistor $R_4$ is provided. The second amplifier stage comprises an operational amplifier $V_2$ to which the operating voltages $+U_B$ and $-U_B$ are applied through terminals 7 and 8. The D output of the first amplifier stage is applied to an inverting input 2 of the second amplifier stage. The operating point for the non-inverting input 3 of operational amplifier $V_2$ is adjusted through a second voltage divider formed by resistors $R_6$ and $R_7$. The feedback of output 1 to the non-inverting input 3 is effected both through a capacitor $C_2$ to junction $K_1$, and directly to junction $K_2$. The AC voltage potentials of junctions $K_1$ and $K_2$ are therefore equal to each other and no division by resistors $R_6$ and $R_7$ of the AC voltage fed back takes place. The combination of a capacitor $C_3$ and a resistor $R_9$ suppresses a possible tendency of the operational amplifier to oscillate at high frequencies in the megaherz range due to the feedback of output 1 to inverting input 2. The electric charge returns to the capacitor microphone capsule 100 through a resistor $R_1$ of very high resistance, of a magnitude of some gigaohms. The output voltage of the entire arrangement is available at a capacitor $C_4$.

Figure 4:
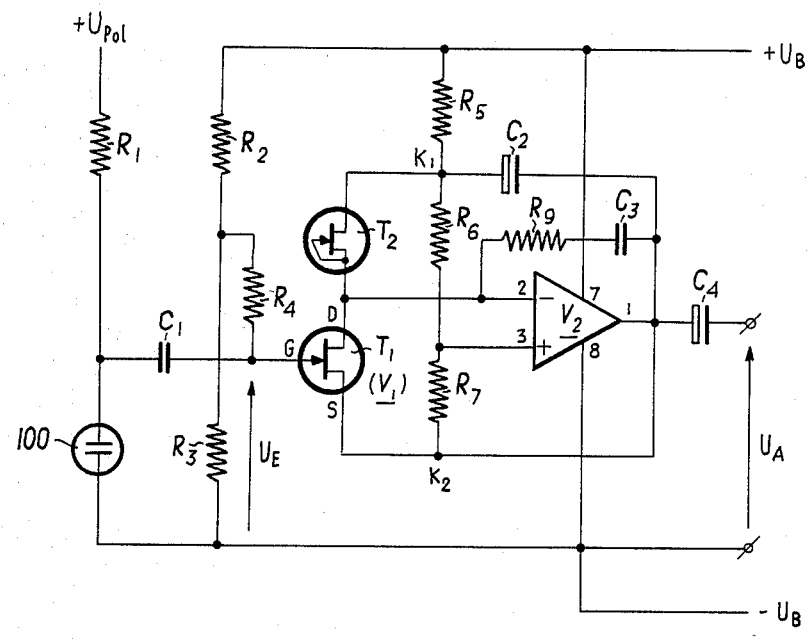
FIG. 4 shows another embodiment thereof.

FIG. 4 shows a circuit arrangement similar to that of FIG. 3, only a constant-current source in the form of a transistor $T_2$ is provided instead of load resistor $R_8$.

While specific embodiments of the invention have been shown and described in detail to illustrate the application of the principles of the invention, it will be understood that the invention may be embodied otherwise without departing from such principles.

What is claimed is:

1. An impedance transformer circuit for a capacitive voltage source comprising:
   a first amplifier stage having a high input impedance and gain, a load resistance, an output and two inputs;
   a second amplifier stage having a high gain, an output, an inverting input and a non-inverting input; and
   a reference potential connection;
   said first stage output connected to said second stage inverting input, said second stage output connected in feedback connection to said second stage non-inverting input and to one of said first stage inputs, said load resistance being controlled by a capacitive voltage source connected between the other of said first stage inputs and said reference potential connection, said reference potential connection not being connected to any input of said first and second amplifier stages, and said load resistance of said first amplifier stage being connected between said inverting and non-inverting inputs of said second amplifier stage.

2. A circuit according to claim 1, wherein said first and second amplifier stages are connected so that their overall combined gain is about one.

3. A circuit according to claim 1, wherein said reference potential connection is at a reference potential of zero.

4. A circuit according to claim 3, wherein said first amplifier stage comprises a field effect transistor having a gate adapted to be connected to the capacitive voltage source, a drain connected to said second amplifier stage inverting input and a source connected to said second amplifier stage output.

5. A circuit according to claim 4, including said load resistance connected between said drain and said second stage output.

6. A circuit according to claim 5, wherein said load resistance comprises a transistor connected as a constant current source.

7. A circuit according to claim 5, including a positive voltage source and a negative voltage source, negative with respect to said positive voltage source, said second amplifier stage comprising an operational amplifier having control inputs connected respectively to said positive and negative voltage sources, said negative voltage source connected to said reference potential connection, a first voltage divider connected across said positive and negative voltage sources, a feed resistor connected between said voltage divider and said field effect transistor gate.

8. A circuit according to claim 6, including a positive voltage source and a negative voltage source, negative with respect to said positive voltage source, said second amplifier stage comprising an operational amplifier having control inputs connected respectively to said positive and negative voltage sources, said negative source connected to said reference potential connection, a first voltage divider connected across said positive and negative voltage sources, a feed resistor connected between said voltage divider and said field effect transistor gate.

9. An impedance transformer circuit for a capacitive voltage source having a high output impedance, particularly for capacitor microphones, comprising a first and second sequentially connected amplifier stages with an overall gain of about one, with the output (4) of the first amplifier stage ($V_1$) exhibiting high input impedance and, of itself, a high gain ($v_1$) connected to an inverting input (2) of the second amplifier stage ($V_2$) which, of itself, exhibits a high gain ($v_2$), the output (1) of the second amplifier being fed back connected to a non-inverting input (3) thereof and to the first amplifier stage which acts as a resistor controlled by the capacitive voltage source, wherein for AC current, a load resistance of the first amplifier stage is located between the inverting input (2) and the non-inverting input (3) of the second amplifier stage, and a reference zero potential for the input and output AC voltage signals is not provided by any of inverting or non-inverting inputs of the two amplifier stages.

10. A circuit according to claim 9, wherein, the first amplifier stage comprises a field-effect transistor ($T_1$) which is electrically conductively coupled to an operational amplifier comprising the second amplifier stage ($V_2$) and the field-effect transistor is connected in common-source connection.

11. A circuit according to claim 10, wherein a current source is provided as a load resistor for the field-effect transistor ($T_1$), having a high dynamic internal resistance and being embodied by a transistor ($T_2$) which is connected as a constant-current source.

12. A circuit according to claim 9, wherein the second amplifier stage comprises a discrete entity having at least two transistors.

13. An impedance transformer circuit for capacitive voltage sources having an input AC voltage signal, a high output impedance and an output AC voltage signal, particularly for condenser microphones, comprising a first and a second series connected amplifier stages having a total gain of almost one, characterized in that an output (4) of the first amplifier stage ($V_1$) having a high input impedance and a high gain ($V_1$) is applied to an inverting input (2) of the second amplifier stage ($V_2$) which also has a high gain ($V_2$) and whose output (1) is connected through a feedback network to a non-inverting input (3) thereof and to another feedback network comprising the first amplifier stage ($V_1$) as a resistance controlled by the capacitive voltage source, that a working resistance ($R_8$) of the first amplifier stage ($V_1$) is connected, for AC feedback, between the inverting input (2) and the non-inverting input (3) of the second amplifier stage ($V_2$), and a zero reference potential for the input and output AC voltage signals is equalent to a zero ground potential.

14. An impedance transformer circuit according to claim 13, characterized in that at the circuit input, a FET ($T_1$) is provided as the first amplifier which is conductively connected to an operational amplifier ($V_2$) forming the second amplifier stage ($V_2$), and that the FET ($T_1$) is connected in a source circuit.

15. An impedance transformer circuit according to claim 14, characterized in that the current source having a high dynamic internal resistance is provided as a working resistance for the FET ($T_1$) and embodied by a transistor ($T_2$) which is connected as a constant current source.

16. An impedance transformer circuit according to claim 13, characterized in that the second amplifier stage ($V_2$) is built up as a discrete stage with at least two transistors.

* * * * *